United States Patent
Jarchi et al.

(10) Patent No.: US 7,146,553 B2
(45) Date of Patent: Dec. 5, 2006

(54) ERROR CORRECTION IMPROVEMENT FOR CONCATENATED CODES

(75) Inventors: Michael D. Jarchi, Northridge, CA (US); Satish K. Sridharan, West Hills, CA (US)

(73) Assignee: Infinera Corporation, Sunnyvale, CA (US)

( * ) Notice: Subject to any disclaimer, the term of this patent is extended or adjusted under 35 U.S.C. 154(b) by 309 days.

(21) Appl. No.: 10/301,769

(22) Filed: Nov. 20, 2002

(65) Prior Publication Data

US 2003/0106009 A1   Jun. 5, 2003

Related U.S. Application Data

(60) Provisional application No. 60/332,022, filed on Nov. 21, 2001.

(51) Int. Cl.
*H03M 13/29* (2006.01)
*H03M 13/33* (2006.01)

(52) U.S. Cl. .............. 714/755; 714/752; 714/782; 714/784

(58) Field of Classification Search ........... 714/755, 714/752, 746, 784, 781, 782
See application file for complete search history.

(56) References Cited

U.S. PATENT DOCUMENTS

| | | | | |
|---|---|---|---|---|
| 3,609,682 A * | 9/1971 | Mitchell | ............ | 714/760 |
| 3,925,611 A * | 12/1975 | Dennis | ............ | 380/31 |
| 5,347,403 A * | 9/1994 | Uekusa | ............ | 360/3 |
| 5,537,429 A * | 7/1996 | Inoue | ............ | 714/755 |
| 5,737,343 A * | 4/1998 | Meyer | ............ | 714/784 |
| 6,009,553 A * | 12/1999 | Martinez et al. | ............ | 714/784 |
| 6,029,264 A | 2/2000 | Kobayashi et al. | ............ | 714/755 |
| 6,192,497 B1 * | 2/2001 | Yang et al. | ............ | 714/781 |
| 6,421,804 B1 * | 7/2002 | Lee | ............ | 714/755 |
| 6,634,007 B1 * | 10/2003 | Koetter et al. | ............ | 714/784 |
| 6,823,002 B1 * | 11/2004 | Betts | ............ | 375/219 |
| 2001/0007578 A1 | 7/2001 | Ran et al. | ............ | 375/253 |
| 2001/0050622 A1* | 12/2001 | Hewitt et al. | ............ | 341/50 |
| 2002/0049947 A1 | 4/2002 | Sridharan et al. | ............ | 714/752 |
| 2002/0056064 A1 | 5/2002 | Kidorf et al. | ............ | 714/755 |
| 2002/0095629 A1 | 7/2002 | Umeda | ............ | 714/701 |

OTHER PUBLICATIONS

Shu Lin et al., "Error Control Coding : Fundamentals and Applications", pp. 170-177 and pp. 278-280, Prentice Hall, 1983.
Richard Blahut, "Theory and Practice of Error Control Codes", pp. 198-201, Addison-Wesley Publishing Company, 1983.

* cited by examiner

*Primary Examiner*—Albert Decady
*Assistant Examiner*—Dipakkumar Gandhi
(74) *Attorney, Agent, or Firm*—W. Douglas Carothers, Jr.

(57) ABSTRACT

An enhanced forward error correction system is disclosed. Transmitted data is encoded into codewords in multiple dimensions. The decoding of received data by a decoder is performed in multiple passes in each dimension, with corrected data provided as an output from each pass into another decoder for the next decode pass. The encoder in one embodiment comprises a parallel inner RS(247,239) encoder or encoders and parallel outer BCH(255,247) encoder or encoders. Additional steps are added for error multiplication reduction. The system provides an approach to detect generally uncorrectable patterns for concatenated codes and provides a correction mechanism for improving error correction performance.

18 Claims, 5 Drawing Sheets

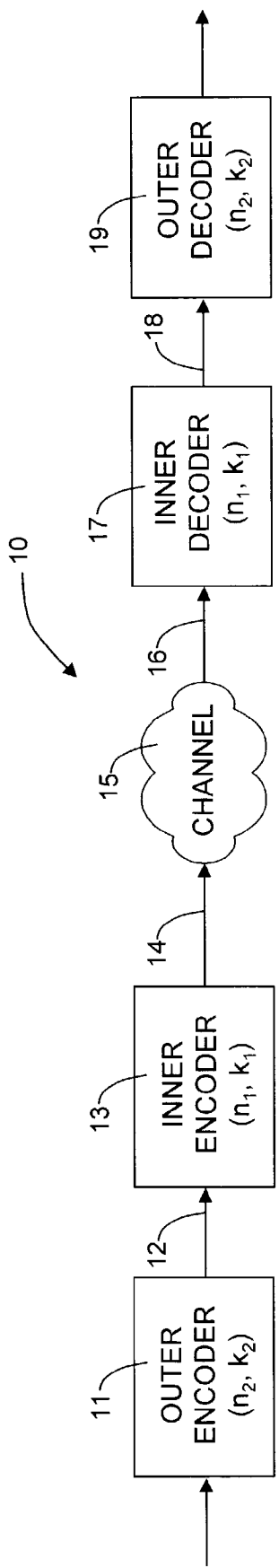
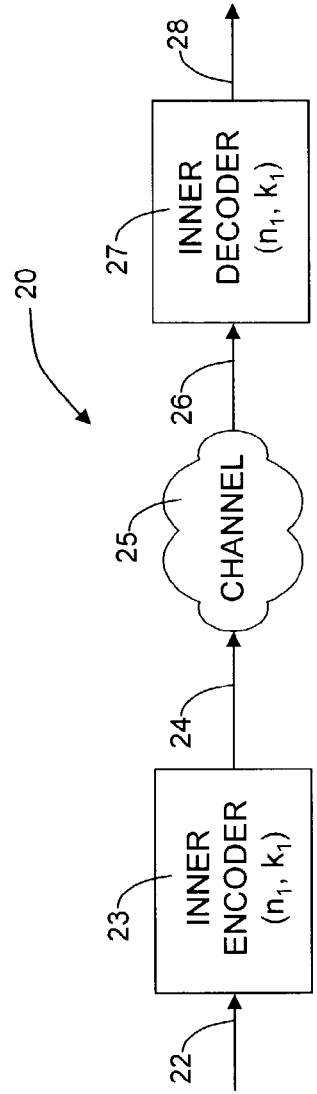
FIG. 1 (PRIOR ART)
FIG. 2

ERROR CORRECTION IMPROVEMENT FOR CONCATENATED CODES

BACKGROUND OF THE INVENTION

This application claims priority of U.S. provisional application, Ser. No. 60/332,022, filed Nov. 21, 2001, which application is incorporated herein by its reference.

BACKGROUND OF THE INVENTION

1. Field of the Invention

This invention relates generally to forward error correction (FEC) systems, and in particular to a concatenated code, based forward error correction (FEC) system.

2. Description of the Related Art

Digital electronic systems store and transmit copious amounts of information. Storage or transmission of digital information sometimes results, however, in corruption of some of the data or payload. Defects in a storage media, or errors in the reading and writing of data from a storage media, may result in data errors. Similarly, transmission of data through a transmission channel may result in errors, through noise in the transmission channel or the inability of the transmitting or receiving unit to properly transmit or read data. As data storage and data transmission may be viewed as transmitting data to a media using a transmitting unit, and thereafter reading the data using a receiving unit, the remaining discussion will be in terms generally of data transmission. However, the utility of this invention extends to other error correction applications including, but not limited to, optical and electronic data storage systems, digital cable television systems and high definition television.

Forward error correction (FEC) is often used to increase data reliability. Generally speaking, FEC systems encode data using an encoder at a transmitter and decode data using a decoder at the receiver. During encoding, redundant information is added to the data. The redundant information allows determination by receiving units as to whether or not corruption of received data has occurred, and if so, identifies the particular data that has been corrupted and corrects the data. The redundant coded information allows the data to be corrected but within certain limits. The FEC decoder generally decodes the data, generates an error polynomial, and uses the error polynomial to determine corrections to be applied to the data.

The encoded data is generally grouped in terms of codewords. One type of codes falls in a category of block codes where a codeword is comprised of n symbols, of which k symbols are information symbols. Block coding consists of adding n-k redundancy symbols to k information symbols originating from source encoding at a transmitter and the redundancy symbols are utilized at a receiver to correct certain transmission errors. The codeword, therefore, contains n-k redundant symbols. The symbols are data words comprised of m bits. In a systematic encoding system, the n-k redundant symbols are appended to the information symbols, while in a non-systematic code the information symbols are also modified. For instance, for BCH codes, $n=2^m-1$ and $k=n-mt$. To correct t bits within the codeword, mt bits of overhead/redundancy is needed. Each of the k and n symbols is made of 1 bit. For Reed-Solomon (RS) codes, $n=2^m-1$ and $k=n-2t$. For RS codes, to correct t symbols within the codeword, 2t symbols of redundancy are needed. Each of the k and n symbols comprise m bits.

In the error correction process, error multiplication is possible. This occurs when enough errors are introduced to a codeword where the codeword more closely resembles another valid codeword than the originally transmitted codeword. The distance between valid codewords is known as the minimum distance $d_{min}$ of the code and is given the value of 2t+1. For small values of t and/or high error rate transmissions, error multiplication becomes more prevalent.

In order to increase data transmission reliability, increased numbers of redundant symbols are required. The use of additional redundant symbols, however, decreases the effective bandwidth of a transmission system or reduces the total amount of storage space available in a storage system. Moreover, the use of additional redundant symbols increases the amount of processing and processing time performed by both the transmitting unit and the receiving unit to create or interpret the redundant symbols.

Moreover, different coding schemes have different abilities to correct different types of errors. For example, errors may be randomly distributed in a data set, or the errors may be grouped together, i.e. be burst or clustered errors. Generally speaking, increasing the number of bits within a symbol increases the ability of an FEC system to correct burst errors. However, increasing the number of bits per symbol also increases encoding and decoding circuit size and power requirements since the codeword becomes longer.

A method for achieving higher performance of forward error correction codes without the use of very long codes is to use a family of codes known as concatenated codes which is illustrated in system 10 of FIG. 1. Concatenation of two error correcting codes utilizes an inner encoder or decoder and an outer encoder or decoder where the terms, "inner" and "outer" have reference to physical location of the encoders in the transmission system relative to the communication channel. A block code, such as a Reed-Solomon (RS) code may be deployed as the outer code and another block code, such as a Bose-Chaudhuri-Hocquenghem (BCH) code may be deployed as the inner code. For background relative to concatenation coding, see the book of Shu Lin and Daniel Costello entitles, "Error Control Coding: Fundamentals and Applications", pp. 278–280, Prentice Hall, 1983 and the book of Richard Blahut entitled, "Theory and Practice of Error Control Codes", pp. 198–201, Addison-Wesley Publishing Company, 1983. Also, see the more recent book on coding of Irving S. Reed and Xuemin Chen entitled, "Error Control Coding for Data Networks", Kluwer Academic Publishers, 1999.

As shown in FIG. 1 with concatenated encoders 11 and 13 where outer encoder 11 has a non-binary code ($n_2$, $k_2$) and is coupled, via line 12, to inner encoder 13 which has a binary code ($n_1$, $k_1$). The output of encoder 13 on line 14 is connected to the transmission channel 15 and received by a receiver via line 16 comprising concatenated decoders 17 and 19 where inner decoder 17 decodes binary code ($n_1$, $k_1$) and outer decoder 19 decodes non-binary code ($n_2$, $k_2$).

Concatenation coding is a particular method for constructing long codes from shorter codes. A simple concatenated code is formed from two codes: an ($n_1$, $k_1$) binary code $C_1$ and an ($n_2$, $k_2$) non-binary code $C_2$. Usually, $C_2$ is a non-binary code such as Reed-Solomon and $C_1$ is a binary BCH code. A $k_1 k_2$ grouping of information bits are to be encoded. The $k_2$ symbols of $C_2$ are represented by their corresponding symbols of $k_1$ binary symbols. If the minimum distance of the inner and outer codes is $d_1$ and $d_2$ respectively, the minimum distance, $d_{min}$, of the concatenated code is at least $d_1 d_2$. Relative to non-binary block codes, see Shu Lin et al., supra, pages 170–177.

FIG. 1 illustrates the typical encoding process which consists of two steps. The $k_2$ symbols are encoded according to the rules for $C_2$ to form an $n_2$ symbol code vector. Second, the $k_2$ symbols are divided into $k_1$ symbol groups and encoded as an $n_1$ symbol code vector according to the rules for $C_1$. These $n_1 n_2$ digits are then transmitted one $C_1$ vector at a time in succession into transmission channel 15.

The decode process is also a two step process typically always beginning with the inner code first. Decoding is performed for each $C_1$ code vector as it arrives, and the check digits are removed, leaving a sequence of $n_2 k_1$ digits. These symbols are then decoded according to the method for $C_2$ resulting in the final corrected information message $(k_1 k_2)$.

Concatenated codes are effective against a mixture of random and burst errors. The pattern of bytes that are not correctable by the $C_1$ code must form a correctable pattern for $C_2$ if the concatenated code is to correct the error pattern. Scattered errors are generally corrected by $C_1$. Bursts may affect relatively few bytes in the data stream but probably so badly that the inner code $C_1$ cannot correct them; these few bytes of errors can be corrected by $C_2$. Thus, $C_1$ is effective for random distributed errors and $C_2$ is effective for burst or clustered errors.

SUMMARY OF THE INVENTION

According to this invention, a forward error correction system using the concatenated code family with added coding and procedure enhancements to increase error correction capability. According to one embodiment of the invention, two or more constituent correction codes, which are concatenated to accomplish coding tasks, are constructed in two or more dimensions. Further, one or more of the redundancy digits, that is, shared symbols in the different codes, may also be encoded so that they can be correctable by the one or more of the constituent codes.

A further feature of this invention is a decoding process where multiple decoding passes are utilized on each constituent code for improved correction performance. Further, the correction capability of one or more of the constituent codes may be reduced for a portion of the multiple pass decoding process to reduce overall error multiplication in order to benefit the final error correction performance. The invention also includes a decoding process to reduce error multiplication by monitoring the result of some of the general correction information. The invention further provides for code error floor reduction by adding an algorithm for detecting and removing some error patterns that cannot be generally corrected by a concatenated code followed by a final decoding pass of one or more constituent codes.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts

FIG. 1 is a schematic view of a concatenated code system known in the art.

FIG. 2 is a schematic view of a concatenated code system as deployed in this invention.

DETAILED DESCRIPTION OF THE INVENTION

Reference is now made to FIG. 2 which illustrates a data transmission system 20 in accordance with the present invention. Data 22 is provided to an encoder 23. Encoder 23 forms information words from the data and multiplies the information words by a generator matrix to form a codeword. In an alternate embodiment, the remainder is computed when the information vector is divided by the generator polynomial as the remainder is subsequently added to the original information vector to form the codeword. As discussed below, the encoder performs multidimensional concatenated encoding. In the exemplary embodiment described herein, the codes employed are the (247,239) Reed-Solomon (RS) and (255, 247) Bose-Chaudhuri-Hocquenghem (BCH) codes. Each symbol for the RS code is 8 bits (byte) and each symbol for the BCH code is one bit. The RS codeword is 239×8-bit information bits and 8×8-bit redundant bits. The BCH codeword is 247 information bits and 8 redundant bits. It is also possible to contemplate the use of other block codes, e.g., hamming code or fire code, for one or both of the error correction codes. In another approach, one or both of the codes use other error correction codes, such as convolutional codes (e.g., turbo code, auto-orthogonal code, Hagelbarger code or Iwadare code).

The method of integrating concatenated codes of this invention is to assemble, or interleave, a number of outer codes to create a combined codeword information section and to integrate a number of inner codes in an orthogonal orientation. A further feature of the invention is the expansion of the concatenation process to treat the entire inner codeword(s), which is comprised of information plus the correction redundancy symbols, as the information vector for the outer code(s). In this manner, the inner code redundancy symbols undergo error detection and correction.

Figure 3:
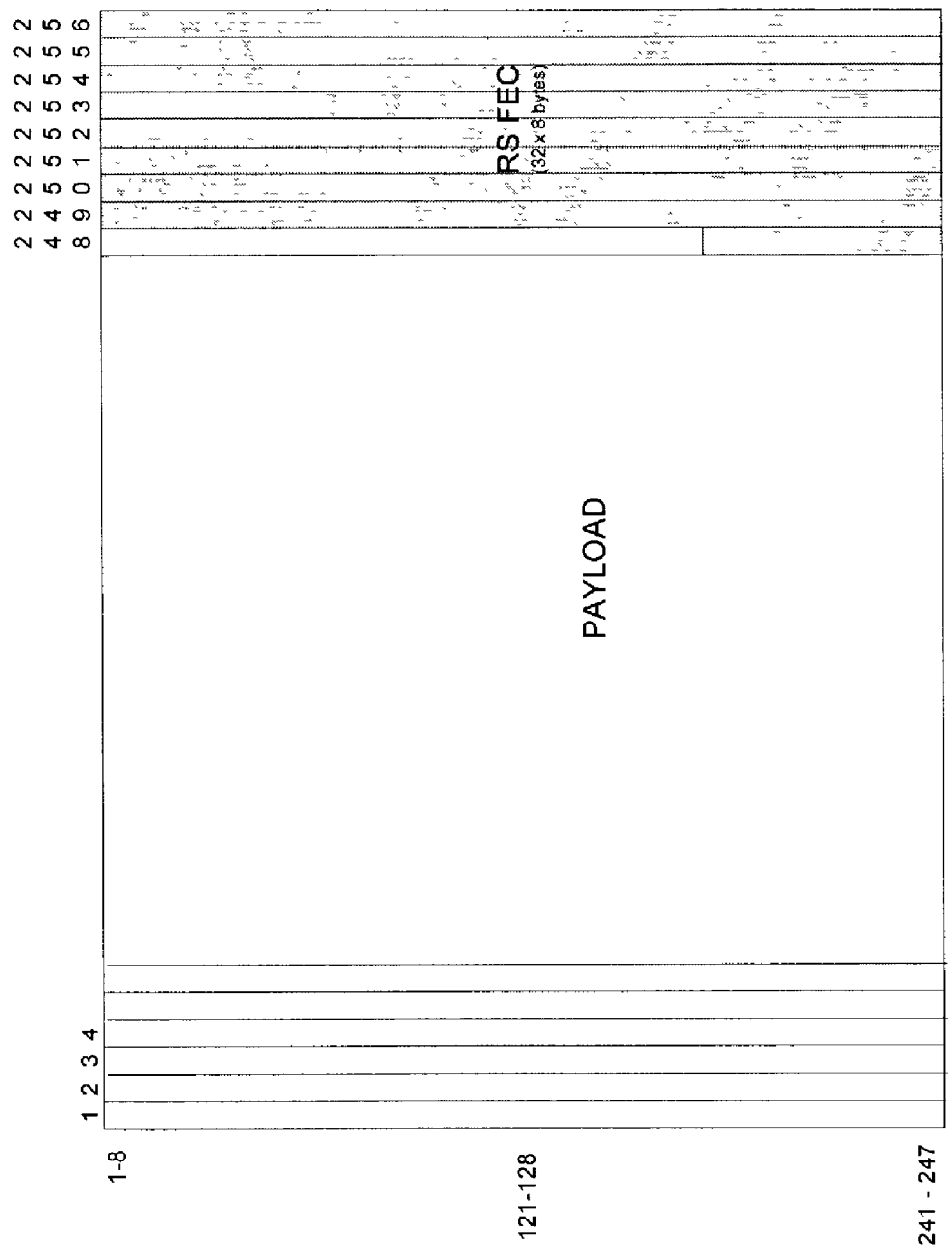
FIG. 3 is an illustration of the outer code frame construction using RS(247,239) encoding.

In an exemplary embodiment, the inner code is constructed with 256 BCH (255,247) codes and the outer code constructed of 32 interleaved RS (247,239). In this example, 32×239 byte symbols of information is encoded into 32 RS (247,239) encoders. As the serial information stream is received, it is converted into 8-bit symbols and sequentially passed to each RS encoder; in this manner each RS encoder receives a byte symbol of one out of sixteen symbols. After inner code encoding completes, the inner BCH (255,247) codes uses the outer codeword as the information stream to encode. With 32 RS codes×247 symbols/code×8-bit/symbol=63232 bits comprising the inner codewords; this yields the 247-bit information vectors for 256 BCH codewords. The outer code interleave of the RS code improves burst error tolerance beyond a single RS code by the number of interleaves. FIG. 3. shows an illustration of the outer encoding process.

Figure 4:
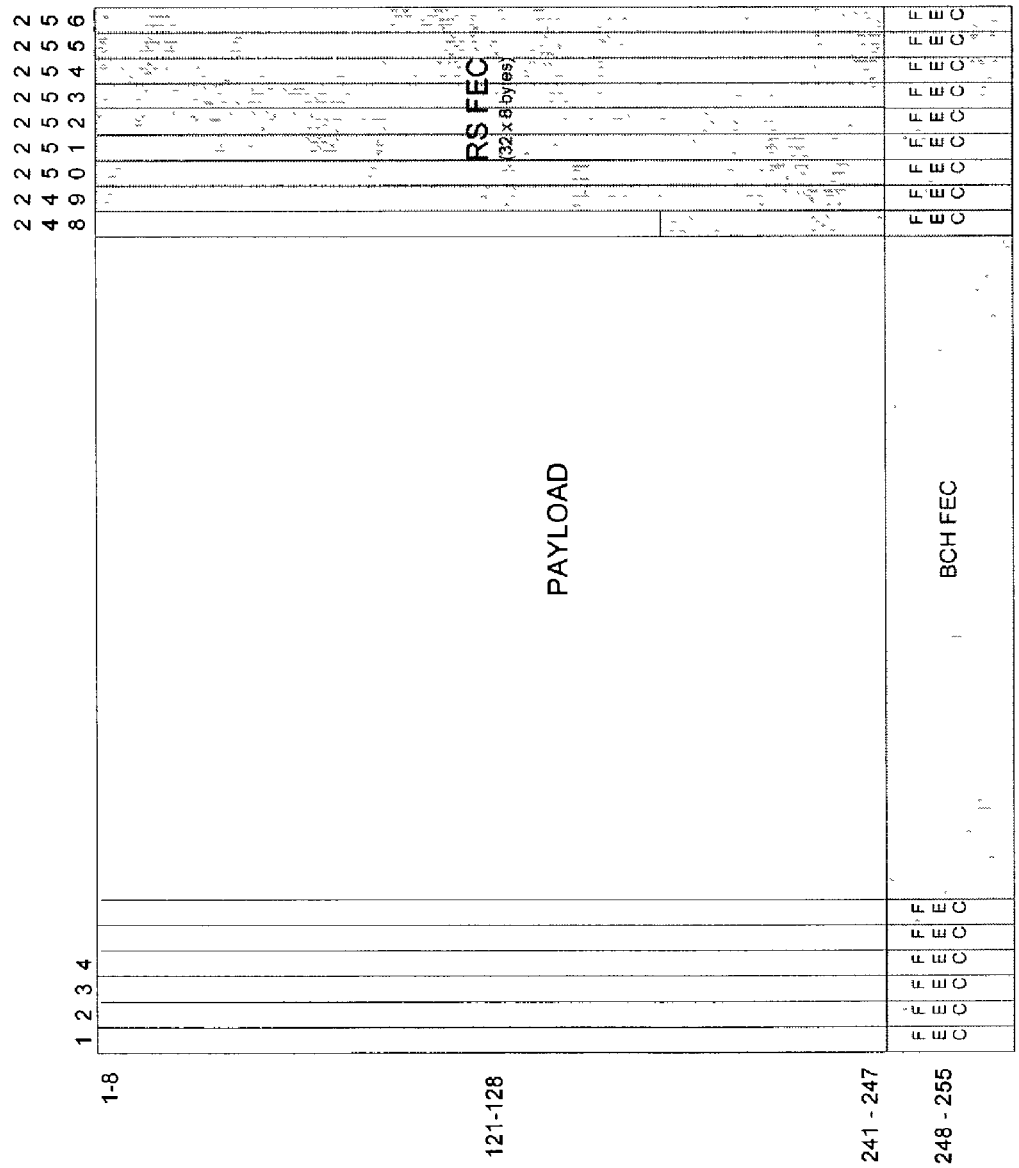
FIG. 4 is an illustration of the inner code frame construction using BCH(255,247) encoding orthogonally interleaved with the RS(247,239) encoding.

In a further embodiment, sequentially, a byte symbol from each of the 32 interleaved RS codewords are used to assemble the 247 bit information vector to be encoded by the inner code; the next 247 bit vector is then assembled where the first one stopped. By assembling the inner and outer codewords in an orthogonal or nested manner, advantages in error correction of codewords can be achieved if multiple decode processing passes are used. As each decode process pass occurs for each constituent code, additional error reduction can occur since errors remaining in some inner codeword may be eliminated in another outer code decoding pass, or vice-versa. FIG. 4. shows an illustration of the frame after performing inner encoding.

Figure 5:
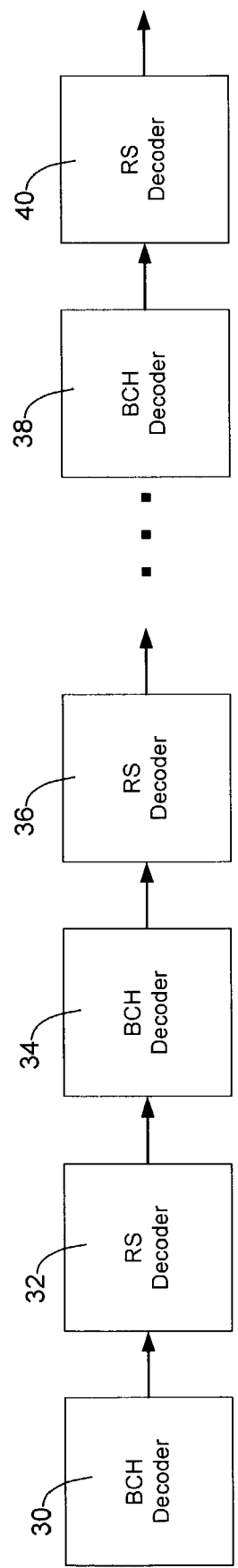
FIG. 5 is a schematic view of the cascaded BCH and RS decoder modules utilized in the decoding process of this invention.

The multiple pass decode process is achieved by cascading decoder hardware for each of the multiple decode passes as illustrated in FIG. 5. This is performed by having the received DataStream enter a BCH codeword decoder 30, then an RS decoder 32, then a BCH decoder 34, then a RS decoder 36, and then a final BCH decoder 38, and then the final RS decoder 40. After all decoder passes are complete, the correction information in memory can be applied to the original data stream. If the first pass of inner and outer decoding can be speeded up by employing higher core clock frequencies in the hardware, then the same hardware can be reemployed to perform the next pass of inner and outer decoding since the next data frame is not yet ready to be processed. Thus, with faster clocking frequencies, the amount of cascaded decoders can be reduced through recirculation of the decoding process through the same BCH/RS decoder pair while a subsequent data frame is still being assembled.

During the various passes of performing the inner and outer code decoding algorithms, there are situations were error multiplication can occur due to incorrect decoding. When the number of errors that are present in a codeword are beyond the error correction capacity of the codeword, then incorrect decoding can occur. The decoding algorithm used in the decoding process of trying to correct errors, actually introduces errors. This phenomenon is particularly pronounced during the earlier passes of decoding. Although error multiplication can occur during a decode process, the number of errors introduced can be less than the number of errors corrected thereby still providing an overall benefit. Future passes could attempt to correct these newly introduced errors and any other errors that are still left behind. However; when error multiplication occurs, this can cause an increase in difficultly in future passes to correct all errors. This might necessitate a requirement for more decoding passes, thus increasing the hardware implementation complexity and an increase in the decoding latency. Error multiplication can also cause an increase in probability of uncorrectable error patterns to occur that cannot be fixed by either the inner or outer codes. Thus, it is important to reduce error multiplication as much as possible.

In this invention employing multi-dimensional coding using a multiple pass decoder system for concatenated codes, additional improvements can be made to reduce error multiplication. In this invention, both codes have small values for t where error multiplication can hinder the final correction performance especially if targeted for high bit error rates. For the RS code, this invention deploys the degree of the error locator polynomial to determine if t or more errors exist. In this case, a check that t and only t error locations (or polynomial roots) of the error locator polynomial exist will enable the correction process to occur. In this manner, some miss-corrections to other closer codewords can be inhibited. This does not eliminate all miss-corrections, however, since a codeword can be in error by greater than t errors yet appear to be only t errors away from another valid codeword and, thus, will be miss-corrected to that nearer codeword.

A further aspect of this invention is to reduce error multiplication by limiting the correction performance of early decode passes below its ability of t. This technique reduces the error correction capacity of the decoding algorithm during earlier passes. For instance, with the (247,239) RS codeword that can correct 4 symbol errors, if there are 5 symbols in error from codeword1; this can look like codeword2 having only 4 symbol errors. This can result in incorrect decoding to codeword2 thereby introducing 4 new symbol errors. If we had limited the error correction capacity of the algorithm to only 3 symbols, although it can correct 4 symbols, this problem could have been avoided. Thus, in the above case, if four or more symbol errors are deemed to have occurred, no decoding is performed, thereby eliminating the possibility of introducing the 4 symbol errors. The presence of four or more symbol errors is detected by the degree of the error locator polynomial. This technique however, this does not prevent a 6 symbol error codeword from being incorrectly decoded and thus adding 3 new symbol errors. This is because, the codeword1 with 6 symbols in error can look like a codeword2 with only 3 symbol errors and, thus, incorrect decoding can occur. However, the probability of having 6 symbols in error would be less than the probability of having 5 symbols in error. The downside of this technique is that valid 4 symbol errors will not be corrected. But, if the next pass can correct 4 symbol errors, this error pattern can be rectified. Thus, an appropriate choice of increasing error correction capacity can be chosen with the decoding pass that is being performed.

A further aspect of this invention is to reduce error multiplication by allowing soft decode outputs from one decoder to the next decoder. This technique to reduce error multiplication is to provide signaling mechanisms between the inner and outer decoding algorithms. In this approach, the first BCH decode pass would provide soft decode information to the next RS decode pass if there are errors left behind after the BCH decode process. Since there are 256 BCH codewords, a total of 256 soft decode signals are provided to the next RS decode pass. Of these 256 signals, 'x' of them could indicate that there are errors left behind while the remaining would indicate that there are no error left after the first pass BCH decode process. After such a soft decode information has been obtained from all the BCH decoders, the RS decoder now has sufficient information on where the potential error location could be for it to decode. Knowing which BCH codewords ('x' total) have errors left behind, and knowing where a specific RS codeword intersects these BCH codewords (at one symbol location for each BCH codeword), the RS decoder can deduce the potential symbol locations where it can locate errors. Thus, the RS decoder is allowed to correct errors in only those locations as indicated by the previous BCH decoder. Under certain cases, the BCH decoder could incorrectly decode and thus may not indicate the presence of errors for the RS decoder. Thus the RS decoder will be allowed to find errors at a certain number of error locations that have not been indicated by the BCH decoder. This process is performed for each of the interleaved RS codewords. Therefore, the soft decode information provided to the RS decoder from the BCH decoder helps in locating errors in specific locations thereby reducing error multiplication.

In a similar fashion, the RS decoder can now provide soft decode output to the next BCH decoder if the RS decoder has any errors left behind. In this case, there are 32 RS codewords of which 'y' codewords may have errors left behind. Knowing which RS codewords have errors left behind, and knowing where a specific BCH codeword intersects these RS codewords (8 bit locations for each RS codeword), the BCH decoder can deduce the potential bit locations where it can locate errors. Thus, the BCH decoder is allowed to correct errors in only such locations as indicated by the previous RS decoder. This process is performed for each of the interleaved BCH codewords. Therefore, the soft decode information provided to the BCH decoder from the RS decoder helps in locating errors in specific locations thereby reducing error multiplication.

Figure 6:
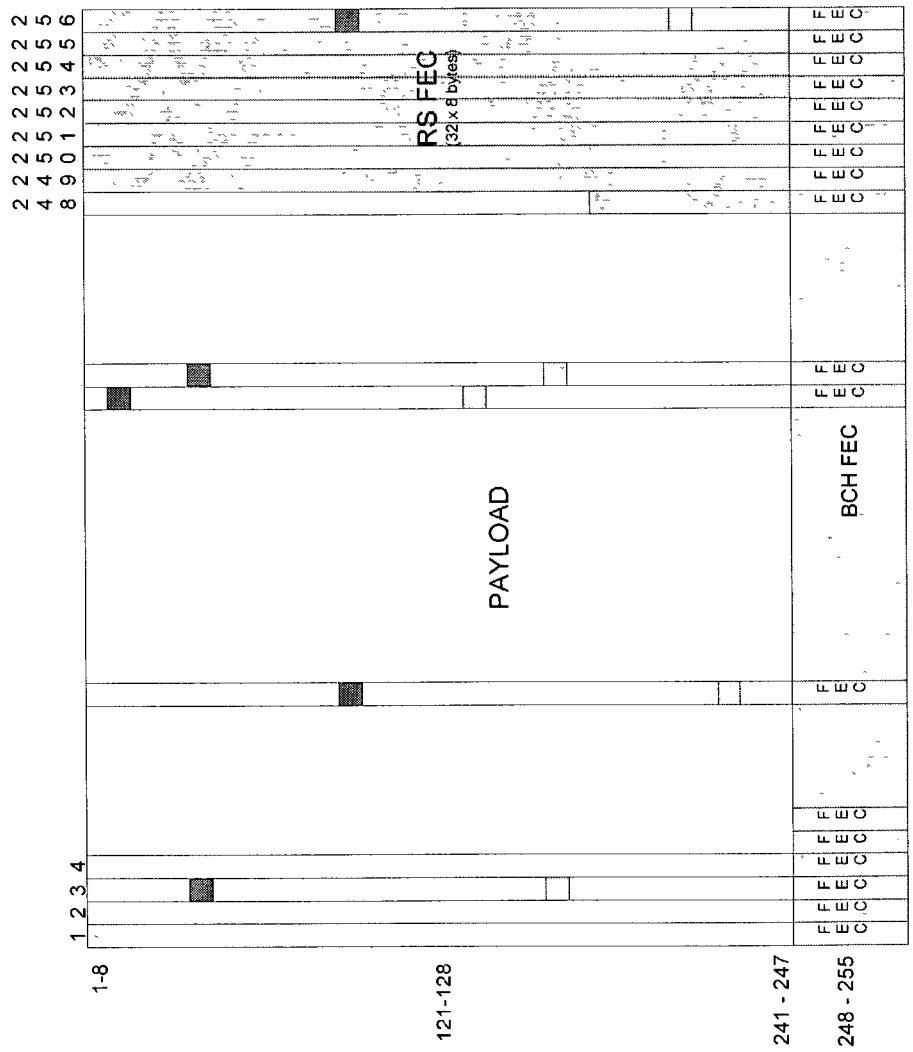
FIG. 6 is an illustration of orthogonal inner and outer code frame structures exemplifying a situation where codewords may be uncorrectable.

The employment of the methods just described, however, may be insufficient to correct some errors in certain circumstances. For example, a number of errors that exceed the error correction capability of each constituent code may exist in the junction location between the orthogonal codewords in the concatenated code. Where the excessive errors in the codeword are beyond the correction capability of the codeword, errors will actually begin to be added. This is called error multiplication. Relative to the previously described RS-BCH concatenated code of this invention, an example of how this may occur is when five bit errors exist in each of two RS codewords with each bit error existing in different RS symbol bytes. This is illustrated in FIG. 6. In this figure, there are two RS codewords that each have 5 symbol errors. Since the maximum error correction capacity of the RS decoder is 4 symbols, these two codewords cannot be corrected. As shown in FIG. 6, it can so happen that the errors that occurred in the RS codewords could line up in such a way that there are 5 BCH columns that each have more than 1 bit in error, although quite clearly this may not occur too frequently. Since the error correction capacity of the BCH decoder is only 1 bit, these 5 columns cannot be corrected. Thus, irrespective of the number of passes that are used to operate during the decode process, this error pattern cannot be fixed. This represents an error floor limit of the concatenated code, i.e., uncorrectable error patterns. The RS and BCH decoders can provide information on which codewords have errors left behind. Thus, the intersection of these codewords provides information at possible locations of the errors. However, since each RS codeword intersects a specific BCH codeword in a symbol of 8 bits, we would not be able to determine the exact bit location where the error exists just by looking at the intersection of the codewords that are in error. Since there are 2 RS codewords in error, a given BCH has 16 possible locations where there could be two or more errors.

In another approach, an added algorithm to detect and remove these uncorrectable code errors locates the junction of the orthogonal codewords containing errors by using non-zero syndrome information of the constituent codes. In the present invention, each of the 32 RS syndromes are used with the 256 BCH syndromes to determine the junction location of errors. For the targeted error rates, it is assumed that only two RS codewords will be in error in majority and the below additional error correction process will not be performed if more than two RS codewords are in error. The added uncorrectable error algorithm in the invention can be enhanced to accept more than two RS codewords in error but is not pursued for implementation reasons, i.e., beyond two codewords the hardware implementation becomes much complex and the it is not worth the effort for the ultimate amount of error correction that will be achieved.

The invention employs the error junction location in the BCH codeword to begin a trial-and-error process for correction. With the general locations of the errors identified (two possible 8 bit locations), all combinations and permutations (8×8=64 in total) of error corrections patterns to the BCH codeword are performed and BCH codeword syndromes re-calculated. When a zero syndrome calculation is achieved for the attempt, that correction pattern is selected and is then used to remove the errors from the BCH codeword and the corrected codeword is provided as output. The trial-and-error process is performed in a parallel fashion with syndrome hardware for each error permutation in the junction locations. Once the zero syndrome is identified, the appropriate correction mask for the location is applied to the BCH codeword. In this trial and error technique it is possible that out of the 64 possible choices, there is more than one case that yields a zero syndrome. In such a situation, one of the choices is randomly selected. This could however result in two extra bits being introduced in error rather than the current two error bits being corrected. There are also cases where there are more than 1 bit is in error in the RS symbol that intersects a specific BCH codeword. This will result in 3 or more bits being in error in the BCH codeword. Since we are searching for only 2 bit patterns, the 3 bit pattern cannot be corrected. However, overall, of the 5 BCH codewords that have errors, if at least one of them can be corrected by the trial and error technique, then there would now be only 4 symbol errors in each of the RS codewords which can be corrected by another pass of the RS decoding algorithm. So effectively, this algorithm needs to only fix some of the errors that caused the error floor and the final pass can fix the rest of the errors present in the codeword.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A method of increasing error correction capability in an error correction system using a plurality of encoders and decoders using block coding wherein codewords are encoded and decoded using concatenated codes and utilizing iterative decoding, the method comprising the steps of:

encoding data into codewords in multiple dimensions, with each dimension having a plurality of encoders;

after transmission, decoding the codewords in each dimension with a plurality of decoders through a plurality of iterative decoding passes;

checking the degree of the error locator polynomial providing an indication as to how many codeword errors are expected arid verifying that expectation by a number of solved polynomial roots found so that when the agree of the error locator polynomial is equal to a error correction capability of t and if the number of solved roots is also equal to t, then codeword correction is performed, else if the number of solved roots does not equal t for an error locator polynomial of degree t, then codeword correction is not performed to avoid codeword miscorrections; and if the codeword correction is to be performed, then correcting codeword errors for error locator polynomials through multiple successive iterative decoding passes with each pass having a degree that is less than the error correction capability of t so that probability of any codeword miscorrections is reduced.

2. The method of claim 1 comprising the further steps of monotonically increasing the degree of error locator polynomial through successive iterative decoding passes until the degree is equal to the error correction capability of t at which time decoding is terminated.

3. The method of claim 1 wherein the step of checking and performing codeword correction is accomplished further by performing multiple successive iterative decoding passes for correcting code errors limited below the determined degree of error correction capability t so that miscorrections are reduced.

4. The method of claim 1 wherein the step of checking and performing codeword correction is accomplished further by employing a previous decoder to determine any remaining errors left behind by its decoding step and providing information to a subsequent decoder about a number of remaining codeword errors and their block code intersect location to permit codeword corrections only at those locations curing a subsequent decoding step by the subsequent decoder.

5. The method of claim 4 wherein the step of checking and performing codeword correction is accomplished further by utilizing iterative decoding where the subsequent decoder of claim 4 becomes the previous decoder and the previous decoder of claim 4 becomes the subsequent decoder.

6. The method of claim 1 wherein the block coding is accomplished employing different types of codes for each dimension.

7. The method of claim 1 wherein the different types of code are a Reed-Solomon (RS) code or a Bose-.Chaudhuri-Hocquenghem (BCH) code.

8. The method of claim 1 wherein the step of checking and performing codeword correction is accomplished by performing iterative decoding passes employing the same decoders.

9. An error correction system for increasing error correction capability comprising:
   multiple encoders for encoding symbols forming multiple codewords in multiple dimensions where each dimension has a plurality of encoders;
   multiple decoders for decoding the codewords in each dimension with a plurality of decoders;
   means to check a degree of the error locator polynomial for an indication as to how many codeword errors are expected;
   means to verifying tat expectation by a number of solved polynomial roots found;
   means to perform codeword correction if the degree of the error locator polynomial is equal to a error correction capability oft and the number of solved roots is also equal to t;
   said performance correction means preventing codeword correction if the number of solved roots does not equal t for an error locator polynomial of degree t to avoid codeword miscorrections;
   said performance correction means enabling codeword correction in multiple iterative decoding passes for error locator polynomials with a degree that is less than the error correction capability of t per pass to reduce codeword miscorrections from occurring in initial iterative decoding passes.

10. The error correction system of claim 9 wherein said performance correction means enabling codeword correction in multiple iterative decoding passes to monotonically increase the degree in each subsequent pass until the degree equals the error correction capability of t.

11. The error correction system of claim 9 wherein said performance correction means enables codeword correction by performing multiple iterative decoding passes for correcting code errors limited below the determined degree of code correction capability t so tat miscorrections are reduced.

12. The error correction system of claim 9 wherein said performance correction means enables codeword correction by performing iterative decoding passes through previous and subsequent decoders wherein the previous decoder determines any remaining errors left behind by its decoding operation and provides information to the subsequent decoder about a number of remaining codeword errors and their block code intersect location to permit codeword corrections only at Those locations by the subsequent decoder.

13. The error correction system of claim 12 wherein said previous and subsequent decoders are the same decoders in iterative decoding passes.

14. The error correction system of claim 12 wherein said previous and subsequent decoders are sets of such decoders.

15. The error correction system of claim 9 wherein a block coding in multiple dimensions is a different type of code for each dimension.

16. The error correction system of claim 15 wherein the different types of code are a Reed-Solomon (RS) code and a Bose-Chaudhuri-Hocquenghem (BCH) code.

17. The error correction system of claim 9 wherein the decoders in at least one dimension are Bose-Chaudhuri-Hocquenghem (BCH) decoders and in at least one other dimension are Reed-Solomon (RS) decoders.

18. The error correction system of claim 9 wherein said multiple encoders comprise at least a pair of encoders wherein the first encoder a Reed-Solomon (RS) encoder and the second encoder is a Bose-Chaudhuri-Hocquenghem (BCH) encoder.

* * * * *